United States Patent
Odagawa et al.

(10) Patent No.: US 8,778,701 B2
(45) Date of Patent: *Jul. 15, 2014

(54) METHOD FOR PRODUCING SPIN INJECTION ELECTRODE

(71) Applicant: Panasonic Corporation, Osaka (JP)

(72) Inventors: Akihiro Odagawa, Osaka (JP); Nozomu Matsukawa, Nara (JP)

(73) Assignee: Panasonic Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/854,665

(22) Filed: Apr. 1, 2013

(65) Prior Publication Data

US 2013/0217151 A1    Aug. 22, 2013

Related U.S. Application Data (63) Continuation of application No. PCT/JP2011/006463, filed on Nov. 21, 2011.

(30) Foreign Application Priority Data

Nov. 22, 2010 (JP) ................ 2010-259742

(51) Int. Cl.
*H01L 21/00* (2006.01)
(52) U.S. Cl.
USPC ................ 438/3; 977/734; 977/742
(58) Field of Classification Search
USPC ........ 438/3; 257/422, E29.323; 977/734, 742
See application file for complete search history.

(56) References Cited

U.S. PATENT DOCUMENTS 7,781,230 B2    8/2010    Odagawa et al.
8,502,332 B2 *  8/2013    Sasaki et al. ............ 257/422
(Continued)

FOREIGN PATENT DOCUMENTS

| JP | 2000-247740 A | 9/2000 |
| JP | 2003-231097 A | 8/2003 |
| JP | 2009-182173 A | 8/2009 |
| JP | 2010-153793 A | 7/2010 |

OTHER PUBLICATIONS

IEICE Technical Report, vol. 108, No. 438, pp. 13-17, 2009 (with English abstract).

(Continued)

*Primary Examiner* — Jarrett Stark
*Assistant Examiner* — Shahed Ahmed
(74) *Attorney, Agent, or Firm* — McDermott Will & Emery LLP (57) ABSTRACT

A production method of the present disclosure includes: a first step of preparing a multi-layer graphene, and an iron oxide that is a ferromagnetic material contacting the graphene and containing $Fe_3O_4$; and a second step of applying a voltage or a current between the graphene and the iron oxide with an electric potential of the graphene being positive relative to that of the iron oxide, so as to oxidize a part of the graphene or oxidize a part of the graphene and a part of $Fe_3O_4$, and thus to form a barrier layer composed of oxidized graphene or of oxidized graphene and $Fe_2O_3$ between the graphene and the iron oxide, and thereby forming a spin injection electrode that includes the graphene, the iron oxide, and the barrier layer located at an interface between the graphene and the iron oxide, and that allows spins to be injected into the graphene from the iron oxide via the barrier layer.

5 Claims, 10 Drawing Sheets

(56) References Cited

U.S. PATENT DOCUMENTS

| | | | |
|---|---|---|---|
| 2003/0186059 A1 | 10/2003 | Hirata et al. | |
| 2004/0052006 A1 | 3/2004 | Odagawa et al. | |
| 2004/0080876 A1 | 4/2004 | Sugita et al. | |
| 2004/0130431 A1 | 7/2004 | Matsukawa et al. | |
| 2010/0092865 A1* | 4/2010 | Kanno et al. | 429/221 |
| 2010/0200839 A1 | 8/2010 | Okai et al. | |
| 2011/0183438 A1* | 7/2011 | Matsumoto et al. | 436/501 |
| 2012/0276455 A1 | 11/2012 | Nishimura et al. | |
| 2013/0217151 A1 | 8/2013 | Odagawa et al. | |

OTHER PUBLICATIONS

Novoselov et al., "Electric Field Effect in Atomically Thin Carbon Films", Science, vol. 306, pp. 666-669, 2004.

Shiraishi et al., "Robustness of Spin Polarization in Graphene-Based Spin Values", Advanced Functional Materials, vol. 19, pp. 3711-3716, 2009.

Koki Takanashi, *Oyo Buturi*, vol. 77, pp. 255-263, 2008 (with partial English translation).

Masashi Shiraishi, "Graphene Spintronics", Journal of the Surface Science Society of Japan, vol. 31, pp. 162-168, 2010 (with English abstract).

Tombros et al., "Electronic spin transport and spin precession in single grapheme layers at room temperature", Nature, vol. 448, pp. 571-575, 2007.

Wang et al., "Magnetotransport properties of mesoscopic graphite spin valves", Physical Review B, vol. 77, 020402(R), 2008.

Yanase et al., "Electronic Structure in High Temperature Phase of $Fe_3O_4$", Journal of the Physical Society of Japan, vol. 68, pp. 1607-1613, 1999.

International Search Report mailed Feb. 7, 2012 issued in corresponding International Application No. PCT/JP2011/006463.

S. Masubuchi et al., "Fabrication of graphene nanoribbon by local anodic oxidation lithography using atomic force microscope," Applied Physics Letters, vol. 94, pp. 082107-1-082107-3, 2009.

Meihua Jin, "Graphene oxide thin film field effect transistors without reduction," Journal of Physics D Applied Physics, vol. 42, No. 13, pp. 135109, 1-5, 2009.

Tomoki Machida, "Fabrication of Graphene Quantum Dots Using Scanning Probe Microscope Lithography," The Murata Science Foundation, Annual Report, No. 24, pp. 434-439, 2010.

Xiaolin Li et al., "Chemically Derived, Ultrasmooth Graphene Nanoribbon Semiconductors," Science, vol. 319, pp. 1229-1232, 2008.

* cited by examiner

METHOD FOR PRODUCING SPIN INJECTION ELECTRODE

This is a continuation of International Application No. PCT/JP2011/006463, with an international filing date of Nov. 21, 2011, which claims the foreign priority of Japanese Patent Application No. 2010-259742, filed on Nov. 22, 2010, the entire contents of both of which are hereby incorporated by reference.

BACKGROUND OF THE INVENTION

1. Field of the Invention

The present disclosure relates to methods for producing spin injection electrodes. More specifically, the present disclosure relates to a method for producing a spin injection electrode for injecting spins into graphene.

2. Description of Related Art

Substances made of carbon (C) take a wide variety of forms including, as well as diamonds, sheets, nanotubes, horns, and balls such as $C_{60}$ fullerene. Furthermore, the physical properties of such substances are more various than their forms. The rich variety of physical properties prompts energetic research and development for application of the substances. Among such substances, a carbon thin film composed of one or several layers is called graphene. Graphene is a substance the isolation of which was realized in 2004, and its singular physical properties as two-dimensional semimetal have been discovered one after another (Science, vol. 306, pp. 666-669 (2004)). For example, graphene exhibits an electron mobility which is ten times or more that of silicon (Si). Therefore, the use of graphene has the possibility of realizing a high-speed and low-consumption electronic device (JP 2009-182173 A). In graphene, spin orbit interaction, which acts as a major factor of spin scattering when spins are used as carriers, is extremely small. For this reason, graphene is expected to be utilized for spin devices (Advanced Functional Materials, vol. 19, pp. 3711-3716 (2009)).

A ferromagnetic material is used as an electrode for spin injection into a graphene. The ferromagnetic material is spin polarized since there is a difference between the numbers of electrons with up-spins and with down-spins contained in the material. Accordingly, this difference is reflected also in spins injected into the graphene, and the graphene can be utilized as a spin device. The graphene used as a spin device may be a single-layer graphene or a multi-layer graphene having two or more layers.

High-efficiency spin injection into a graphene is required in order to achieve sufficient performance as a spin device. The efficiency $P_N$ in spin injection is represented by the following expression: $P_N = P_F / [1 + (1 - P_F^2) \cdot (R_N / R_F)]$ (OYO BUTURI (Applied Physics), vol. 77, pp. 255-263 (2008)). In this expression, $P_F$ is a spin polarization ratio of a ferromagnetic material, $R_F$ is a resistance of the ferromagnetic material, and $R_N$ is a resistance of a non-magnetic material. According to this expression, if the non-magnetic material has a much higher resistance than the ferromagnetic material, i.e., in the case of $R_N \gg R_F$, a relation of $P_N \ll P_F$ is derived, and this means the spin polarization is remarkably reduced at the interface between the materials. Therefore, spins cannot be injected into the non-magnetic material sufficiently. The same applies to the case where the non-magnetic material is a graphene. For good spin injection into a graphene, it is important to ensure consistency of the interfacial resistance between the graphene and a ferromagnetic material which functions as a spin electrode. At present, however, the efficiency in spin injection from a ferromagnetic material into a graphene is extremely low (Journal of the Surface Science Society of Japan, vol. 31, pp. 162-168 (2010)).

In order to realize high-efficiency spin injection into a graphene, the following approaches can be conceived: (1) resolution of inconsistency of the interfacial resistance between a ferromagnetic material and a graphene; and (2) use of a ferromagnetic material that exhibits a high spin polarization ratio $P_F$. For the approach (1), OYO BUTURI, vol. 77, pp. 255-263 (2008) discloses a method in which a barrier layer such as a tunnel barrier is provided between a ferromagnetic material and a graphene. Nature, vol. 448, pp. 571-575 (2007) discloses an example in which aluminum oxide is used as a barrier layer, and Physical Review B, vol. 77, 020402(R) (2008) discloses an example in which magnesium oxide is used as a barrier layer. These barrier layers are each formed on a graphene in advance before a ferromagnetic material is deposited on the graphene. According to these documents, a device structure that allows spin injection from the ferromagnetic material into the graphene is built through the two steps, i.e., the step of forming a barrier layer on the graphene in advance, and the step of depositing the ferromagnetic material on the formed barrier layer. However, in the example disclosed in Nature, vol. 448, pp. 571-575 (2007), the resistance of the device is high, and a good relationship is not established between the interfacial resistance and the spin injection. Therefore, the spin injection efficiency in this example is low, and is 0.1 at a room temperature. In the example disclosed in Physical Review B, vol. 77, 020402(R) (2008), the spin injection itself is not realized at a room temperature. According to determination based on band calculation, ferromagnetic materials that exhibit a high spin polarization ratio $P_F$ include Heusler alloys, $CrO_2$, and $Fe_3O_4$ which is an iron oxide (Journal of the Physical Society of Japan, vol. 68, pp. 1607-1613 (1999)). In band calculation, these ferromagnetic materials exhibit perfect spin polarization. However, although these ferromagnetic materials need to include crystalline phase in order to obtain a high spin polarization ratio, the crystalline phase of each of these materials is not lattice-matched to a graphene having a two-dimensional planar structure composed of six-membered rings. For this reason, spin injection electrodes that use these ferromagnetic materials have not been reported thus far. A method that can realize high-efficiency spin injection into a graphene has been desired.

SUMMARY OF THE INVENTION

One non-limiting and exemplary embodiment provides a method for producing a spin injection electrode that allows high-efficiency spin injection into a graphene.

Additional benefits and advantages of the disclosed embodiments will be apparent from the specification and Figures. The benefits and/or advantages may be individually provided by the various embodiments and features of the specification and drawings disclosure, and need not all be provided in order to obtain one or more of the same.

In one general aspect, the techniques disclosed here feature; a method for producing a spin injection electrode, including: a first step of preparing a multi-layer graphene, and an iron oxide that contains $Fe_3O_4$ and that is a ferromagnetic material contacting the graphene; and a second step of applying a voltage or a current between the graphene and the iron oxide with an electric potential of the graphene being positive relative to that of the iron oxide, so as to: (a) convert a contact area of the graphene with the iron oxide into oxidized graphene by oxidation, and thus to form a barrier layer composed of the oxidized graphene between the graphene and the iron oxide; or (b) convert a contact area of the graphene with the iron oxide, and $Fe_3O_4$ contained in a contact area of the iron oxide with the graphene, into oxidized graphene and $Fe_2O_3$ respectively by oxidation, and thus to form a barrier layer composed of the oxidized graphene and $Fe_2O_3$ between the graphene and the iron oxide, and thereby forming a spin injection electrode that includes the graphene, the iron oxide, and the barrier layer located at an interface between the graphene and the iron oxide, and that allows spins to be injected into the graphene from the iron oxide via the barrier layer.

With the production method of the present disclosure, a spin injection electrode that allows high-efficiency spin injection into a graphene can be obtained.

DETAILED DESCRIPTION

With the production method of the present disclosure, a spin injection electrode can be formed that allows spins to be injected into a graphene via a barrier layer, from a ferromagnetic material formed of an iron oxide containing $Fe_3O_4$. The barrier layer is composed of oxidized graphene located at an interface between the ferromagnetic material and the graphene, or composed of oxidized graphene and $Fe_2O_3$ located at the interface. The production method of the present disclosure achieves both (1) the resolution of inconsistency of the interfacial resistance between a ferromagnetic material and a graphene, and (2) the use of a ferromagnetic material ($Fe_3O_4$) that exhibits a high spin polarization ratio $P_F$, any one of which cannot be conventionally accomplished.

In the production method of the present disclosure, a multi-layer graphene and a ferromagnetic material composed of an iron oxide containing $Fe_3O_4$ are in contact with each other in advance. Next, using, as an electrode, the iron oxide containing $Fe_3O_4$ exhibiting a high spin polarization ratio, an electric bias is applied between the graphene and the iron oxide with an electric potential of the graphene being positive relative to that of the iron oxide. Thus, between the graphene and the iron oxide, (a) a barrier layer composed of oxidized graphene or (b) a barrier layer composed of oxidized graphene and $Fe_2O_3$ is formed. That is, the production method of the present disclosure is a technique in which the interfacial resistance between the graphene and the iron oxide is controlled by application of an electric bias to set an interfacial resistance suitable for spin injection.

Hereinafter, specific embodiments will be described. The scope of the invention is not limited by the specific embodiments and examples described below.

Figure 1:
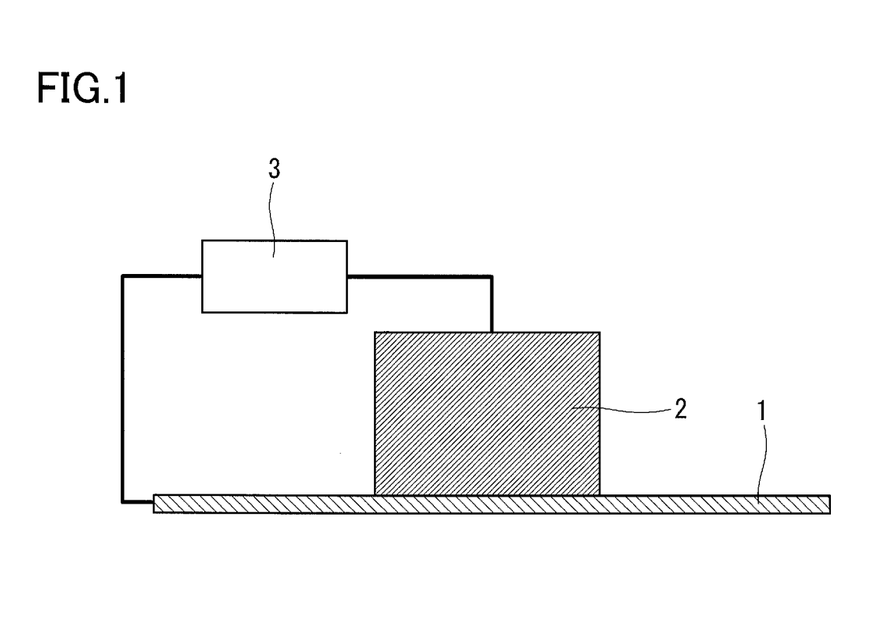
FIG. 1 is a schematic diagram showing an example of a configuration including a graphene and an iron oxide for carrying out the method for producing a spin injection electrode of the present disclosure.

First, as shown in FIG. 1, a graphene 1 and an iron oxide 2 disposed on and in contact with the graphene 1 are prepared (a first step). A bias applying unit 3 is electrically connected to the graphene 1 and the iron oxide 2. Next, an electric bias (a bias voltage or a bias current) is applied between the graphene 1 and the iron oxide 2 using the bias applying unit 3, with an electric potential of the graphene 1 being positive compared to that of the iron oxide 2 (a second step).

The graphene 1 is a multi-layer graphene having two or more layers (carbon atom layers in which carbon atoms are $sp^2$-bonded). If a single-layer graphene is used, a spin injection electrode for injecting spins into the graphene cannot be formed since a contact area of the graphene with the iron oxide 2 is converted into a barrier layer containing oxidized graphene throughout the area in the thickness direction. In order to make a spin injection electrode, a part in the thickness direction of the contact area of the graphene with the iron oxide needs to remain unoxidized (remain graphene). The graphene 1 can be obtained by, for example, exfoliation of a part of single-crystal graphite or highly oriented pyrolytic graphite (HOPG).

The iron oxide 2 is a ferromagnetic material containing $Fe_3O_4$ which is a highly spin-polarized material. If the iron oxide 2 containing $Fe_3O_4$ is used as an electrode for applying an electric bias, the interfacial resistance between the graphene 1 and the iron oxide 2 can be controlled and set to be suitable for spin injection into the graphene 1. The iron oxide 2 may be composed of $Fe_3O_4$. The iron oxide 2 may partly contain $Fe_2O_3$, that is, may be a mixture of $Fe_3O_4$ and $Fe_2O_3$. That is, the iron oxide that further contains $Fe_2O_3$ may be prepared in the first step. $Fe_2O_3$ has more oxygen and higher resistance than $Fe_3O_4$. Therefore, if the iron oxide 2 further contains $Fe_2O_3$, the effect of adding oxygen and applying an electric bias to the graphene is enhanced.

The shape of the iron oxide 2 is not particularly limited as long as the barrier layer is formed at the interface between the graphene 1 and the iron oxide 2 by application of an electric bias between them. For example, the iron oxide 2 is in the form of a bulk, a sheet, a layer, or a particle.

The configuration of the bias applying unit 3 is not particularly limited as long as an electric bias can be applied between the graphene 1 and the iron oxide 2. The same can be said for the electrical connection of the bias applying unit 3 to the graphene 1 and the iron oxide 2. For example, the bias applying unit 3 can be built using a voltage source that applies a constant voltage, a battery, a pulse generator, or the like.

The electric bias applied between the graphene 1 and the iron oxide 2 is, for example, in the form of a pulse (an electric pulse). That is, for example, a pulse voltage or current is applied between the graphene and the iron oxide in the second step. At this time, the pulse voltage or current is applied one or more times, for example.

Although depending on the configuration of the graphene 1 and the iron oxide 2, the value of the voltage or current applied between the graphene 1 and the iron oxide 2 is, for example, 0.05 V to 100 V in terms of voltage. The same can be said for the case where a pulse voltage or current is applied. The pulse width when a pulse voltage or current is applied is 100 ns to 500 μs, for example.

For example, the application of an electric bias to the graphene 1 and the iron oxide 2 is performed until a barrier layer is formed at the interface between the graphene 1 and the iron oxide 2, and a predetermined interfacial resistance is realized between them. For this purpose, the configuration shown in FIG. 2 can be used, for example. The predetermined interfacial resistance can be determined depending on the spin injection characteristics desired for a spin injection electrode. If the interfacial resistance between the graphene 1 and the iron oxide 2 is sharply increased at some point in the application of an electric bias, and then maintains a substantially constant value, the predetermined interfacial resistance can be set to the constant value, for example.

Figure 2:
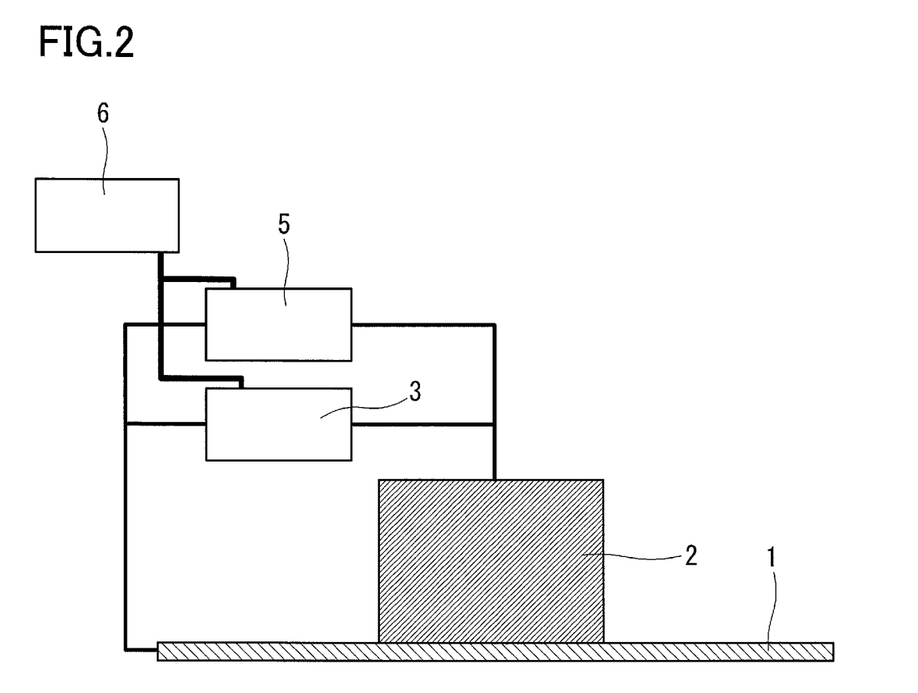
FIG. 2 is a schematic diagram showing another example of the configuration including a graphene and an iron oxide for carrying out the method for producing a spin injection electrode of the present disclosure.

The configuration shown in FIG. 2 further includes a signal detecting unit 5 and a determination unit 6, in addition to the configuration shown in FIG. 1. The signal detecting unit 5 and the determination unit 6 are intended to determine an electric resistance (an interfacial resistance) between the graphene 1 and the iron oxide 2 after start of application of an electric bias. The signal detecting unit 5 is electrically connected to the graphene 1 and the iron oxide 2, and detects an electric signal containing information on the electric resistance value between the graphene 1 and the iron oxide 2. The configuration of the signal detecting unit 5 is not particularly limited as long as the electric signal containing the information on the electric resistance value between the graphene 1 and the iron oxide 2 can be detected. The signal detecting unit 5 can be built using an ammeter, a voltmeter, a source meter, or the like. For example, a semiconductor parameter analyzer is used for the signal detecting unit 5. The determination unit 6 is connected to the bias applying unit 3 and the signal detecting unit 5. The determination unit 6 can be built using an information-processing device such as a personal computer (PC). The information on the electric resistance value is, for example, the electric resistance value itself, and/or information on the change in the electric resistance value.

Figure 3:
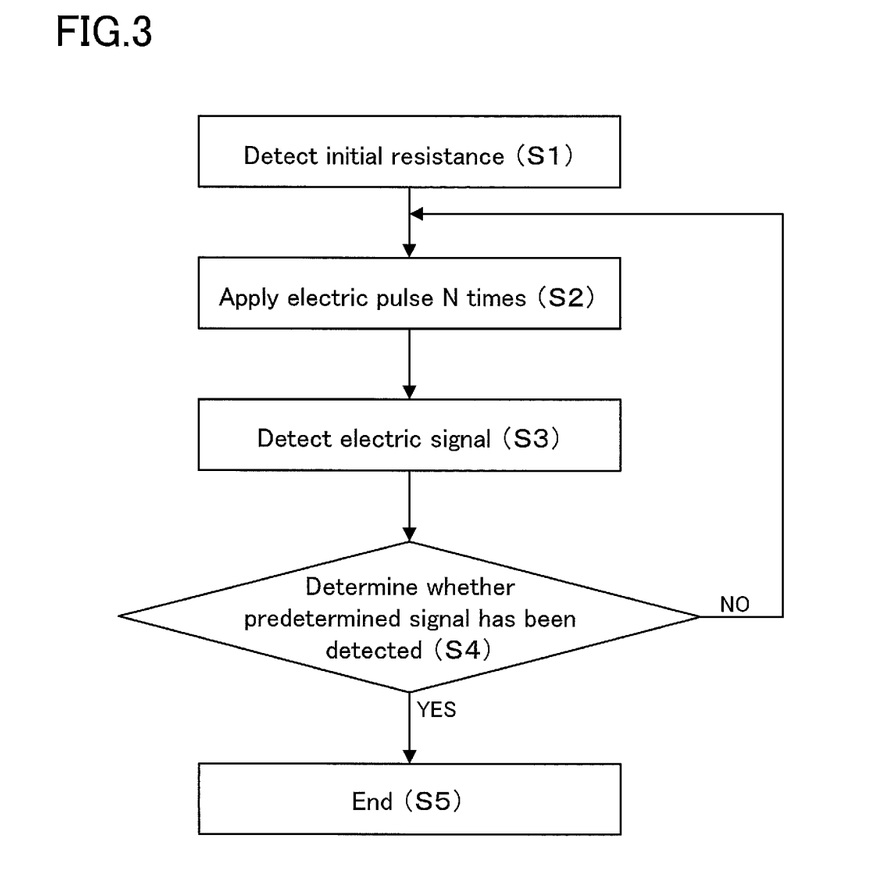
FIG. 3 is a diagram showing an example of a flowchart for carrying out the method for producing a spin injection electrode of the present disclosure, using the configuration shown in FIG. 2.

FIG. 3 shows an example of a flowchart for producing a spin injection electrode that has a predetermined interfacial resistance, using the configuration shown in FIG. 2.

First, the signal detecting unit 5 detects an electric resistance value (an interfacial resistance) between the graphene 1 and the iron oxide 2 (S1). This electric resistance is an initial resistance.

Next, the bias applying unit 3 applies an electric bias (voltage or current) between the graphene 1 and the iron oxide 2, with an electric potential of the graphene 1 being positive relative to that of the iron oxide 2 (S2). In the example shown in FIG. 3, an electric bias in the form of a pulse (an electric pulse) is applied N times. The electric bias applied between the graphene 1 and the iron oxide 2 is not limited to the form of a pulse. For example, a DC bias may be applied for a predetermined time period.

The number of times the electric pulse is applied in S2 can be adjusted based on the magnitude and pulse width of the electric pulse. The number of times the electric pulse is applied in S2, and the magnitude and pulse width of the electric pulse, are adjusted based on, for example, the initial resistance detected in S1. In S2 that is performed for the second and subsequent times when the determination result in S4 is "NO", the number of times the electric pulse is applied in S2, and the magnitude and pulse width of the electric pulse, are adjusted based on, for example, the information detected in S3 as to the electric resistance value (interfacial resistance value) between the graphene 1 and the iron oxide 2.

Next, the signal detecting unit 5 detects an electric signal containing information on the electric resistance value (interfacial resistance value) between the graphene 1 and the iron oxide 2 (S3).

Next, the determination unit 6 determines whether the signal detected by the signal detecting unit 5 is a predetermined signal (S4). The criterion of this determination is whether the interfacial resistance value between the graphene 1 and the iron oxide 2 has reached a predetermined threshold value. That is, the determination unit 6 verifies whether the detected signal is an electric signal that is to be obtained when the electric resistance value (interfacial resistance value) has reached the predetermined value.

In the case where the signal contains the value of the interfacial resistance itself, the determination unit 6 determines, for example, whether or not the value is a predetermined interfacial resistance In the case where the signal contains information on the change in the interfacial resistance value, the determination unit 6 determines, for example, whether or not the amount of change in the interfacial resistance value contained in the detected signal is smaller than or equal to a predetermined threshold value. This can be applied to the case where the change in the interfacial resistance value due to application of an electric bias becomes small after a predetermined interfacial resistance has been reached.

For example, data used as a standard for determination (the predetermined threshold value) is stored in a storage section of the signal detecting unit 5 and/or a storage section of the determination unit 6. The data may be a single electric signal (e.g., a single electric resistance value), or may be a certain range of electric signals (e.g., a range of electric resistance values). The storage section can be formed by, for example, a storage device such as RAM (random access memory) and ROM (read-only memory).

If it is determined in S4 that the predetermined signal has been obtained (the predetermined interfacial resistance has been realized) (YES shown in FIG. 3), the production process ends in accordance with the flowchart (S5). If it is determined that the predetermined signal has not been obtained (the predetermined interfacial resistance has not been realized yet) (NO shown in FIG. 3), the production process returns to S2, and then S2, S3, and S4 are repeated until the determination result "YES" is obtained in S4. The termination of the production process is carried out by, for example, stoppage of application of an electric bias.

That is, in the production method of the present disclosure, the second step may include: a first sub-step of applying a voltage or a current between the graphene 1 and the iron oxide 2; a second sub-step of detecting an electric signal containing information on an electric resistance value between the graphene 1 and the iron oxide 2; and a third sub-step of verifying whether the detected electric signal is an electric signal that is to be obtained when the electric resistance value has reached a predetermined value. Further, in the second step, the first sub-step, the second sub-step, and the third sub-step may be repeated in this order until the detected electric signal is determined as the electric signal that is to be obtained when the electric resistance value has reached the predetermined value.

In another embodiment of the production method of the present disclosure, the conditions for electric bias application that allows for the predetermined value of the interfacial resistance between the graphene 1 and the iron oxide 2 are set in advance, and an electric bias is applied between the graphene 1 and the iron oxide 2 in accordance with the conditions. In this embodiment, a spin injection electrode can be produced using the configuration shown in FIG. 1, through steps S2 and S5 shown in FIG. 3.

In the production method of the present disclosure, an electric bias is applied between the graphene 1 and the iron oxide 2 with an electric potential of the graphene 1 being relatively positive, so as to (a) convert a part of the graphene 1 into oxidized graphene by oxidation, and thus to form a barrier layer composed of the oxidized graphene between the graphene 1 and the iron oxide 2. Alternatively, an electric bias is applied between the graphene 1 and the iron oxide 2 with an electric potential of the graphene 1 being relatively positive, so as to (b) convert a part of the graphene 1 and a part of $Fe_3O_4$ into oxidized graphene and $Fe_2O_3$ respectively by oxidation, and thus to form a barrier layer composed of the oxidized graphene and $Fe_2O_3$ between the graphene 1 and the iron oxide 2. If a barrier layer is formed by these methods, the degree of inconsistency of the interfacial resistance is reduced while favorable structures of the graphene 1 and the iron oxide 2 are maintained. Thus, an electric barrier having an interfacial resistance suitable for spin injection is realized.

With conventional methods, it is extremely difficult to locally and sequentially form a barrier layer composed of oxidized graphene, or a barrier layer composed of oxidized graphene and $Fe_2O_3$, only in the area that corresponds to an electrode interface, and further form a $Fe_3O_4$ crystal exhibiting a high spin polarization ratio on the barrier layer.

The oxidized graphene, which is a component of the barrier layer, has a structure in which a part of $sp_2$ bonds in the graphene have been transformed into $sp_3$ bonds by bonding of oxygen ions. The oxidized graphene is an insulator, in which a band formed on the Fermi surface by $\pi$ bonds in the graphene has been lost. In the production method of the present disclosure, at least one layer of the multi-layer graphene 1 that is in contact with the iron oxide 2 is converted into the oxidized graphene. In other words, a part in the thickness direction of the contact area of the graphene 1 with the iron oxide 2 is converted into the oxidized graphene. $Fe_2O_3$ is an insulator formed by oxidation of $Fe_3O_4$.

Figure 4A:
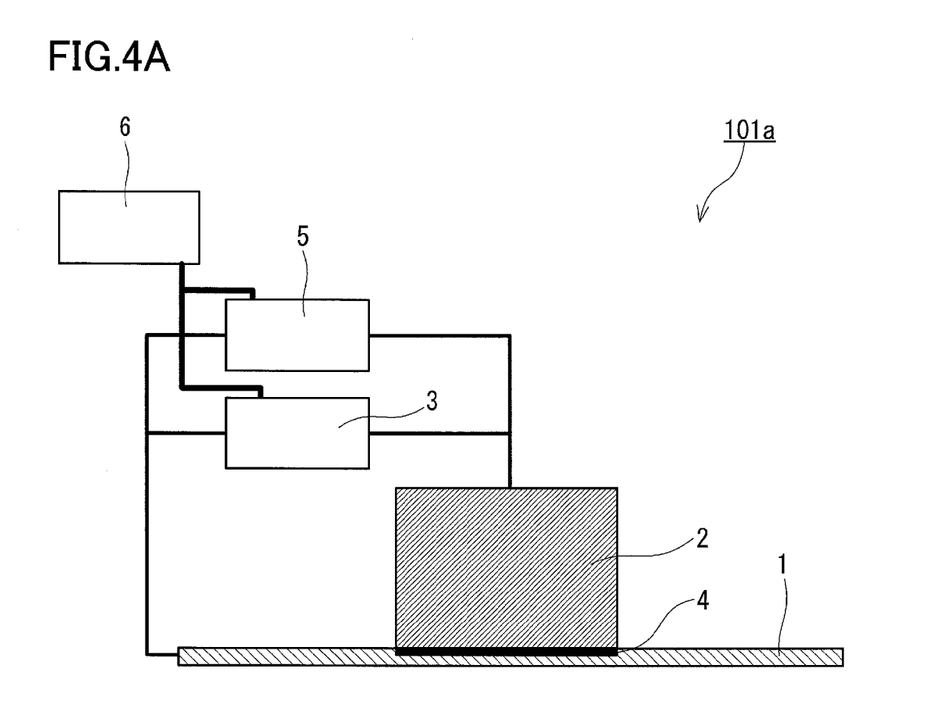
FIG. 4A is a schematic diagram showing an example of a spin injection electrode produced using the configuration shown in FIG. 2 in accordance with the method for producing a spin injection electrode of the present disclosure.
Figure 4B:
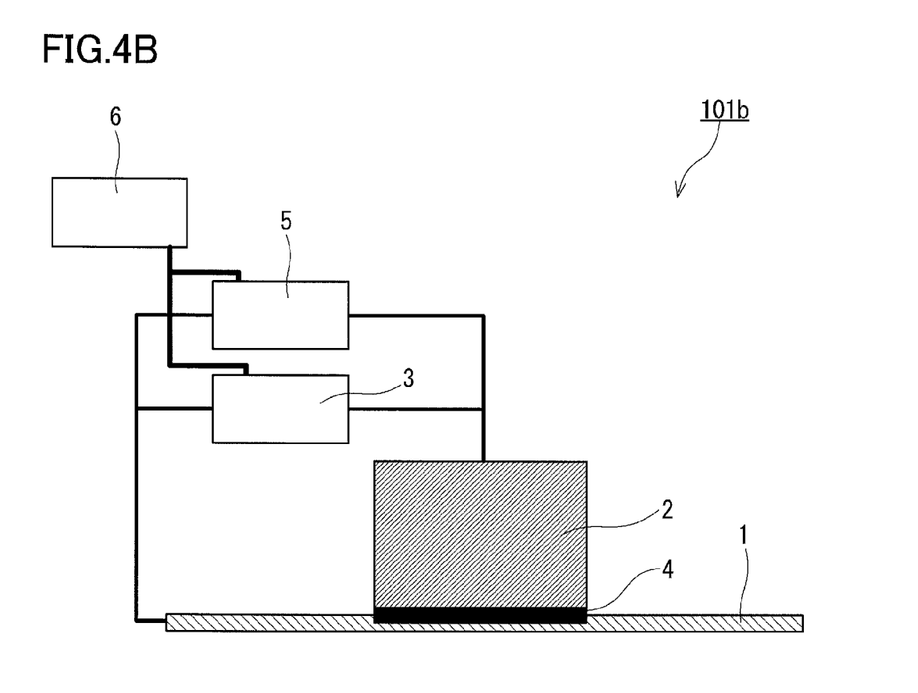
FIG. 4B is a schematic diagram showing another example of the spin injection electrode produced using the configuration shown in FIG. 2 in accordance with the method for producing a spin injection electrode of the present disclosure.

FIG. 4A and FIG. 4B show spin injection electrodes 101a and 101b for spin injection into the graphene that are formed by applying an electric bias between the graphene 1 and the iron oxide 2 using the configuration shown in FIG. 2.

The spin injection electrodes 101a and 101b shown in FIG. 4A and FIG. 4B each include the graphene 1, the iron oxide 2, and a barrier layer 4 located at the interface between the graphene 1 and the iron oxide 2. The spin injection electrodes 101a and 101b allow spins to be injected into the graphene 1 from the iron oxide 2 via the barrier layer 4. The barrier layer 4 of the spin injection electrode 101a shown in FIG. 4A is composed of oxidized graphene, and occupies a part in the thickness direction (a portion in the vicinity of the interface) of the contact area of the graphene 1 with the iron oxide 2. The barrier layer 4 of the spin injection electrode 101b shown in FIG. 4B is composed of oxidized graphene and $Fe_2O_3$, and occupies a part in the thickness direction of the graphene 1 and a part in the thickness direction of the iron oxide 2 (portions in the vicinity of the interface) in their contact areas at which the graphene 1 and the iron oxide 2 are in contact with each other.

The spin injection electrodes 101a and 101b shown in FIG. 4A and FIG. 4B can be formed by application of an electric bias between the graphene 1 and the iron oxide 2. For example, the electric bias application is performed in accordance with the flowchart shown in FIG. 3. The process of formation of the barrier layer 4 can be monitored using the information (e.g., the interfacial resistance value) detected by the signal detecting unit 5. If information on the thickness of the barrier layer 4 being associated with the detected information is stored in the storage section of the signal detecting unit 5 and/or the determination unit 6 in advance, the thickness of the barrier layer 4 can be evaluated using the information on the thickness.

Figure 5:
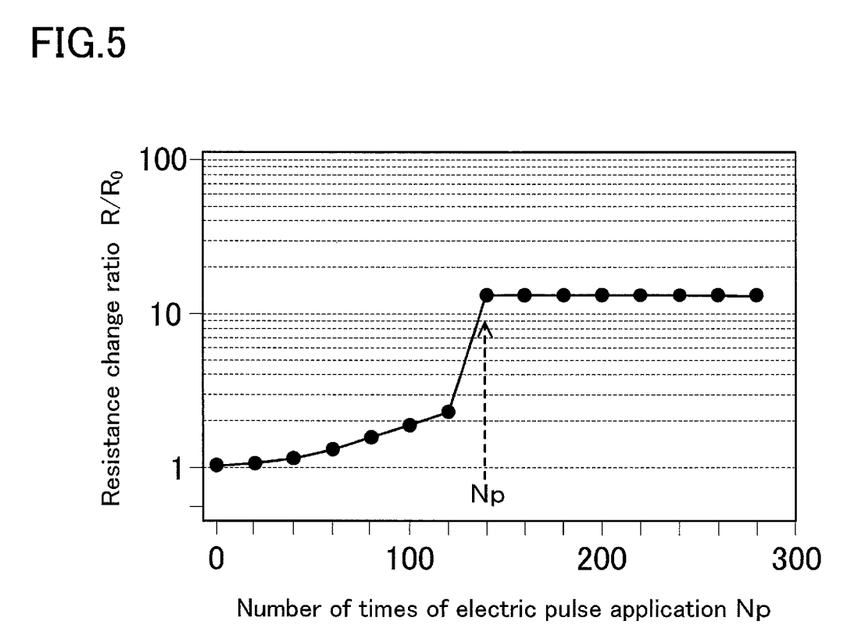
FIG. 5 is a diagram showing an example of the change in an electric resistance value between a graphene and an iron oxide with respect to the number of times of electric pulse application in the case where an electric bias in the form of a pulse (electric pulse) is applied between the graphene and the iron oxide containing $Fe_3O_4$ in accordance with the method for producing a spin injection electrode of the present disclosure.

FIG. 5 shows an example of the change in the interfacial resistance value between the graphene 1 and the iron oxide 2 when an electric pulse is applied between them. In FIG. 5, interfacial resistance values R measured for every 20 times of electric pulse application are shown in terms of the ratio (resistance change ratio $R/R_0$) of R to an interfacial resistance value before electric bias application $R_0$ (an initial resistance value). The size of the area at which the graphene 1 and the iron oxide 2 are in contact is 30 μm×30 μm. The electric pulse applied has a pulse width of 1 μs, and the maximum pulse voltage of 3.5 V. In the example shown in FIG. 5, when the number of times Np of electric pulse application reaches 140, the interfacial resistance value sharply increases, and then becomes constant regardless of the number of times of electric pulse application. In this example, it can be confirmed that the barrier layer 4 is formed at Np=140. The sharp increase of the interfacial resistance value observed in this example can be understood as the same behavior as observed in the case where a constant voltage is applied to a plurality of resistances connected in parallel, and where the resistance value of each of the resistances gradually increases (each of the resistances becomes highly resistive), and the total resistance sharply increases at the moment when the last resistance becomes highly resistive. This behavior realized in the production method of the present disclosure contributes to improvement in uniformity of the interfacial resistance value in the contact area of the graphene 1 and the iron oxide 2. This is because, even if there is a region in which the increase in the interfacial resistance value caused by application of an electric bias is small compared to other surrounding regions, the electric bias applied continuously or next time mainly flows into the region (the region in which the electric resistance value is low), leading to a larger change of the interfacial resistance value in the region than in the other surrounding regions. That is, with the production method of the present disclosure, a spin injection electrode can be formed that has high uniformity of the interface and has equable spin-injection characteristics.

Figure 6:
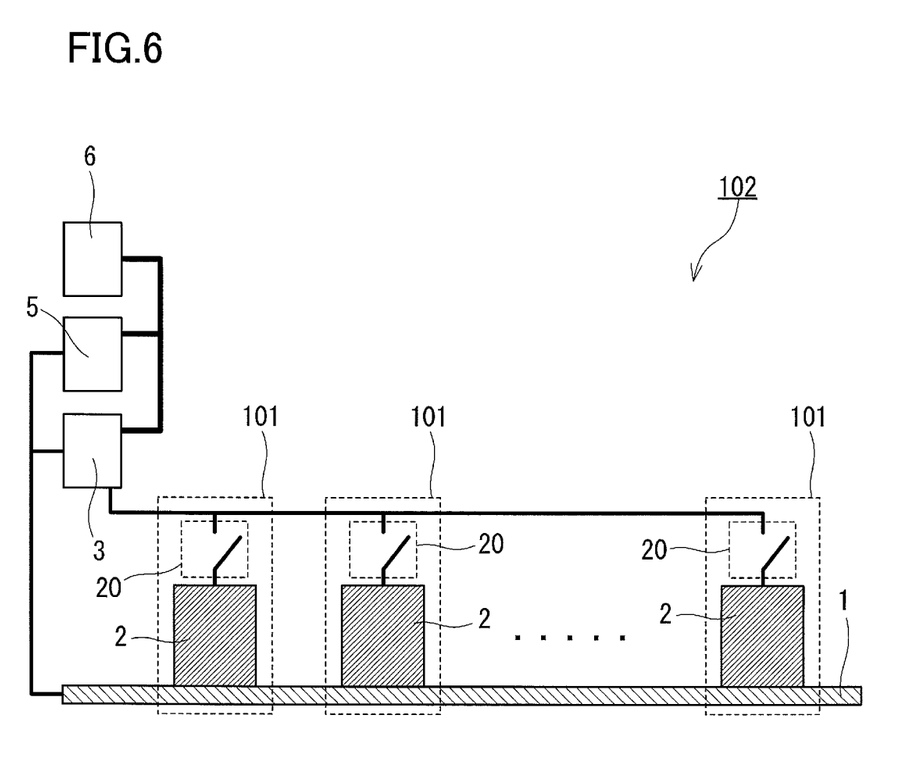
FIG. 6 is a schematic diagram showing an example of a spin injection electrode array obtained by the method for producing a spin injection electrode of the present disclosure.

According to the production method of the present disclosure, a spin injection electrode array can be formed that includes two or more spin injection electrodes each having a desired interfacial resistance value (the interfacial resistance values may be different from or equal to each other). An example of the spin injection electrode array is shown in FIG. 6. A spin injection electrode array 102 shown in FIG. 6 includes two or more spin injection electrodes. Each spin injection electrode 101 has an electric barrier (a barrier layer) located between the graphene 1 and the iron oxide 2, and having a desired interfacial resistance value. This makes it easy to form a spin injection electrode array having desired device characteristics. In order to form the spin injection electrode array 102, for example, switches 20 are each connected to a part of a wire for applying an electric bias between the graphene 1 and the iron oxides 2 as shown in FIG. 6, and the conditions for electric bias application for forming each spin injection electrode are controlled by control of the ON-OFF states of the switches 20. In the example shown in FIG. 6, the spin injection electrodes share the same graphene 1. However, the spin injection electrodes may not necessarily share the same graphene 1.

For example, the graphene and the iron oxide contacting the graphene, which are prepared in the first step, can be formed as described below.

The iron oxide containing $Fe_3O_4$ exhibiting a high spin polarization ratio is a crystalline material having a spinel structure, and the crystal structure is a cubic structure having the lattice constant of a=0.84 nm. By contrast, the graphene has a two dimensional planar structure composed of six-membered rings, and has the lattice constant of a=0.14 nm (b=0.25 nm). Therefore, the iron oxide and the graphene are not lattice-matched even on the assumption of their plane directions and long periods. Accordingly, when an iron oxide containing $Fe_3O_4$ exhibiting a high spin polarization ratio is formed in contact with a graphene, a suitable growth buffer layer is desirably used. However, the spin injection electrode formed by the production method of the present disclosure has a barrier layer between the graphene and the iron oxide. Therefore, the growth buffer layer needs to function also as the barrier layer, or needs to have no interference with the function of the barrier layer. However, a material that meets these conditions is difficult to find. This can be thought as one of the reasons why a stack of a graphene and an iron oxide has not been studied as a spin injection electrode in the past.

In view of the above circumstances, a graphene and an iron oxide that is a ferromagnetic material contacting the graphene are prepared in the first step by, for example, depositing the iron oxide on a surface of the graphene with a pulsed laser deposition method. The pulsed laser deposition method is a technique in which a target material is irradiated with high-energy laser light focused on the target material, and particles emitted by the energy of irradiation are transferred to and deposited on a substrate. In addition, with the pulsed laser deposition method, an undesired damage (e.g., plasma damage) to the graphene is prevented. In Examples of the present disclosure, an excimer laser (KrF: a wavelength of 248 nm) is used. However, another type of pulse laser such as a YAG laser can also be used. The target material is, for example, a sintered body of an iron oxide $Fe_3O_4$. Unlike molecular beam epitaxy (MBE) methods which require ultrahigh vacuum or sputtering methods which can be carried out only within a pressure range in which plasma discharge of noble gas is possible, the pulsed laser deposition method allows the pressure of oxygen gas during deposition to be selected and adjusted in a wide range. Therefore, employing the pulsed laser deposition method allows for more precise control of the composition ratio of oxygen in the iron oxide to be formed.

EXAMPLES

Hereinafter, the present disclosure will provide a more detailed description based on Examples.

Example 1

First, a graphene 1 was prepared by reference to the description of Science, vol. 306, p. 666-p. 669 (2004). Specifically, a cellophane adhesive tape was pushed against a highly oriented pyrolytic graphite (HOPG) having a thickness of 1 mm, to exfoliate a crystalline flake. A cellophane adhesive tape was further pushed against the exfoliated crystalline flake to exfoliate a part of the crystalline flake, and thus a thinner flake was obtained. The operation of exfoliating a part of an obtained flake with a cellophane adhesive tape is repeated a plurality of times, and then a flake of HOPG on a cellophane tape was rubbed onto a substrate made of sapphire. When evaluated using an atomic force microscope (AFM), the thickness of the graphene 1 on the sapphire substrate was about 1±0.5 nm. This thickness corresponds to the total thickness of several layers of graphene. It was separately confirmed that the same result can be obtained even when a substrate made of a material other than sapphire is used, as long as the substrate has a strength sufficient for placement of the flake. In addition, it was separately confirmed that HOPG having a thickness of about several μm does not require use of a substrate. Next, the graphene 1 was subjected to heat treatment in hydrogen at 450° C. for 30 minutes together with the sapphire substrate. This heat treatment was intended to reduce influence of substances adsorbed on the surface of the graphene 1.

Next, a resist was placed on the surface of the graphene 1, and openings for deposition of iron oxides 2 were formed in the resist by electron beam exposure. The resist used was ZEP520A (manufactured by ZEON Corporation) which is a positive resist. The placement of the resist on the graphene 1 was performed using a spin coater. The conditions for the spin coating were that the rotational speed was 2000 rpm for 5 seconds, and then was 4000 rpm for 30 seconds. An electron beam lithography system (ELS-7500 manufactured by Elionix Inc.) was used for electron beam lithography for forming the openings, and the condition for electron beam irradiation was set to 200 μC/cm². The width of the graphene 1 used was 2 μm, and strip-shaped openings (having the minimum width of 50 nm) were formed for the graphene 1.

Figure 7:
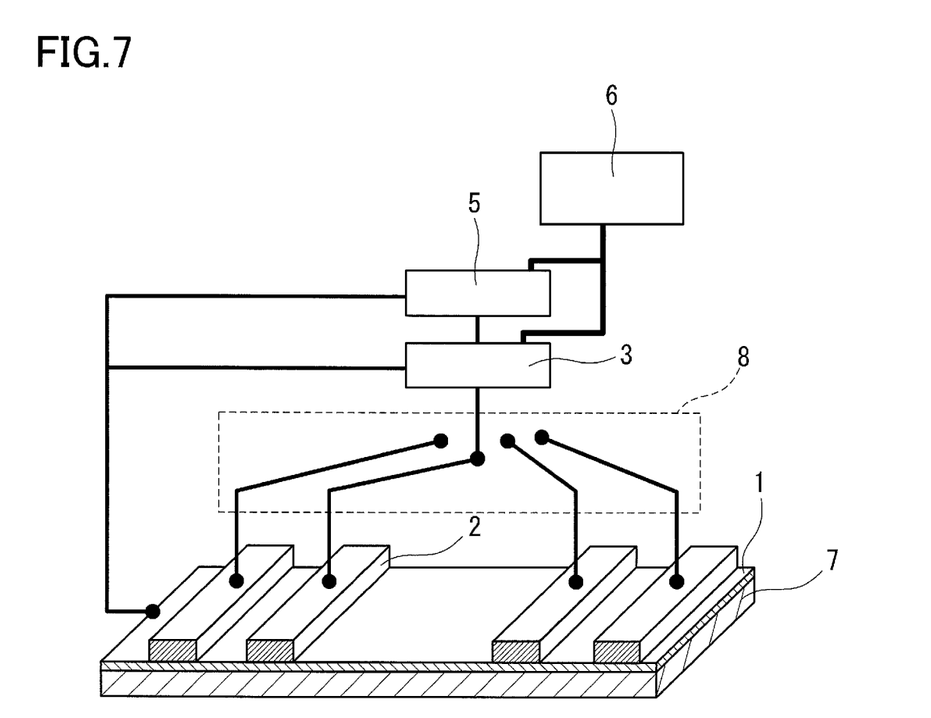
FIG. 7 is a schematic diagram illustrating a method for fabricating a spin injection electrode fabricated in Examples.

Next, the iron oxides 2 were deposited in the openings with a pulsed laser deposition method. A $Fe_3O_4$ sintered body of 20 mm diameter×5 mm thickness was used as a target, and an excimer laser (KrF: a wavelength of 248 nm) was used as a laser. The deposition of the iron oxides 2 was carried out at a substrate temperature of 100 to 400° C. (typically 200° C.), in a pressure atmosphere of $10^{-1}$ to $10^{-5}$ Pa generated by flowing oxygen gas into a vacuum atmosphere whose pressure had once reached $10^{-5}$ to $10^{-6}$ Pa (typically a pressure atmosphere of $5\times10^{-4}$ Pa generated with an oxygen gas flow rate of 0.5 sccm), with a power density for irradiation of the target of 4 to 10 J/cm² (typically 6 J/cm²). The "sccm" used as a unit for the flow rate of oxygen gas means "standard cc/min", and represents a volume of a gas flowing per minute under the standardized conditions of a pressure of 1 atom and a temperature of 0° C. The iron oxides 2 were deposited with a design thickness (50 nm) calculated from the film formation rate. It was separately confirmed that the iron oxides 2 may have any thickness that allows an electric bias to be applied or that allows an electric signal to be detected when S3 and S4 shown in FIG. 3 are performed, and it was also confirmed that when the thickness ranged from 2 nm to several μm, the same result was obtained. Thereafter, the resist was lifted off to fabricate a stack of the graphene 1 and the iron oxides 2 which were formed only in the openings of the resist. The fabricated stack is shown in FIG. 7. In FIG. 7, reference numerals 7 and 8 denote a sapphire substrate and a selector, respectively. In Example 1, the plurality of strip-shaped iron oxides 2 were formed on the graphene 1 in such a manner that their long sides were parallel to each other.

A thin film was separately formed under the same deposition conditions as used for the iron oxides 2, and the structure of the film was evaluated by X-ray diffraction and Raman spectroscopic analysis. It was found that the thin film was formed of a polycrystal mainly containing $Fe_3O_4$. Its specific resistance was about 10 mΩ·cm at a room temperature.

Next, for the purpose of improving electrical contact with the bias applying unit 3 and the signal detecting unit 5, $Fe_3O_4$ (with a thickness of 50 nm) was further deposited on the iron oxides 2 with a pulsed laser deposition method. The deposition conditions were that the substrate temperature was 100 to 400° C. (typically 200° C.), the atmosphere was a vacuum atmosphere of $10^{-5}$ to $10^{-6}$ Pa accompanied with no oxygen gas flow, and the power density for irradiation of the target was 4 to 10 J/cm$^2$ (typically 6 J/cm$^2$).

Next, in order to apply an electric bias to the iron oxides 2 via the deposited $Fe_3O_4$ and also to detect an interfacial resistance value between the graphene 1 and the iron oxides 2, the bias applying unit 3 and the signal detecting unit 5 were electrically connected to the graphene 1 and the iron oxides 2 via the selector 8 composed of relay switches. The selector 8 was configured to apply an electric bias to the plurality of iron oxides 2 formed on the graphene 1 in arbitrary order and combination. A pulse generator 81110A, manufactured by Agilent Technologies, Inc., was used as the bias applying unit 3. A source meter 2425, manufactured by Keithley Instruments Inc., was used as the signal detecting unit 5.

Figure 8:
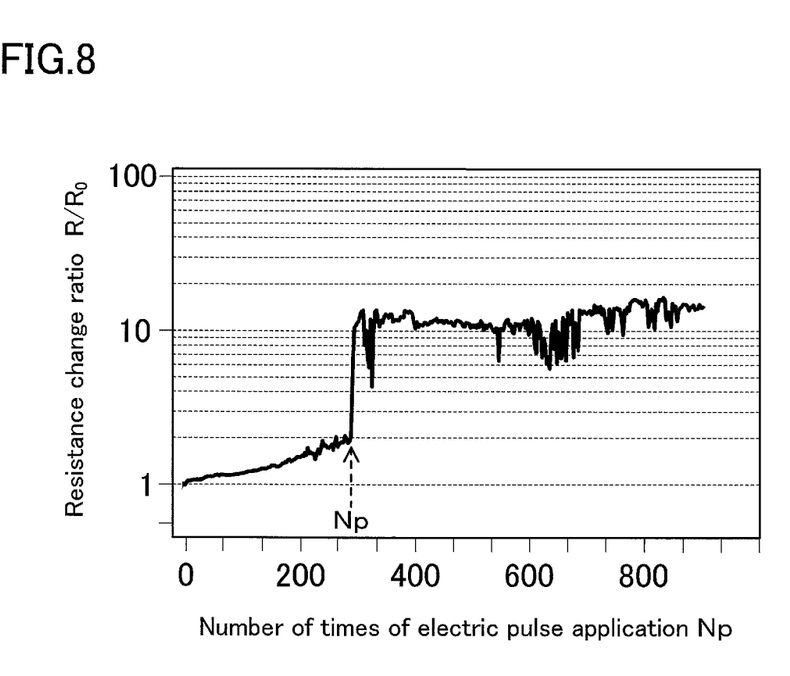
FIG. 8 is a diagram showing the change in an electric resistance value between a graphene and an iron oxide with respect to the number of times of electric pulse application in the case where an electric pulse is applied between the graphene and the iron oxide containing $Fe_3O_4$ in Examples.

Next, an electric bias was applied to the graphene 1 and each iron oxide 2 in accordance with the flowchart shown in FIG. 3, and thus spin injection electrodes were fabricated. The applied electric bias was a pulse voltage having a pulse width of 1 μs and providing a potential difference of 3.5V between the graphene 1 and each iron oxide 2 (with the graphene being positive). FIG. 8 shows the change in the interfacial resistance value between the graphene 1 and the iron oxide 2 when this electric bias was applied. In FIG. 8, interfacial resistance values detected each time the electric pulse was applied are plotted. In FIG. 8, the vertical axis represents the resistance change ratio $R/R_0$ as in FIG. 5. As shown in FIG. 8, when the number of times Np of electric pulse application reached 292, the interfacial resistance value sharply increased, and then maintained a substantially constant value irrespective of electric pulse application. At this point, the barrier layer 4 was formed, and the spin injection electrode was formed. On the other hand, when an electric pulse was applied in the same manner except that the graphene was negative, the change in resistance as shown in FIG. 5 and FIG. 8 was not caused even by 1000 times or more of pulse application.

The change of the graphene 1 in the vicinity of the interface between the graphene 1 and the iron oxide 2 in the fabricated spin injection electrode was confirmed by Raman spectroscopic analysis as an increase in the peak of D band (about 1350 cm$^{-1}$) resulting from a defect. The compositions of the graphene 1 and the iron oxide 2 in the vicinity of the interface between them were evaluated by electron energy loss spectroscopy (EELS) performed on a cross-sectional image observed by a transmission electron microscope. It was confirmed that, after electric bias application, the amount of oxygen increased in the vicinity of the interface, and oxygen diffused in the graphene. It was confirmed that the barrier layer 4 formed by electric bias application was composed of oxidized graphene in which oxygen ions are bonded to graphene, and $Fe_2O_3$ formed by oxidation of $Fe_3O_4$. This result was brought about only when electrons flowed into the graphene 1 from $Fe_3O_4$ contained in the iron oxide 2. It was inferred that the formation of the barrier layer 4 was induced by oxidation reaction based on the movement of surplus oxygen ions contained in $Fe_3O_4$ to the graphene 1.

In addition, influence of surplus oxygen ions contained in the $Fe_3O_4$ layer further deposited on the iron oxide 2 was also considered as a cause. Surplus oxygen ions contained in the $Fe_3O_4$ layer are likely to be reacted with $Fe_3O_4$ in the iron oxide 2 by electric bias application, and thus to change the $Fe_3O_4$ into $Fe_2O_3$. The two phases of $Fe_3O_4$ and $Fe_2O_3$ have a relationship in which rebuilding of Fe ion sites can easily proceed, and oxygen ions can easily move between each other. This can be thought to make a great contribution to the realization of the technique of the present disclosure. In addition, there is a possibility that the difference between the Gibbs free energy associated with oxidation of carbon and the Gibbs free energy associated with oxidation of $Fe_3O_4$ into $Fe_2O_3$ has a negative value over a wide temperature range. When the difference in free energy has a negative value, oxidation of carbon is more stable than oxidation of an iron oxide. According to an Ellingham diagram showing the free energies of various oxides, it is indicated that oxidation of carbon is stable in a temperature range of 300° C. or higher. Actually, since local generation of a high heat based on the electric resistance of the iron oxide 2 is anticipated to occur due to application of an electric bias to the graphene 1 and the iron oxide 2, the above stability of oxidation of carbon is qualitatively consist with the result of this Example in which oxidation of the graphene 1 was prompted at the time of electric bias application. That is, it can be thought that the result of this Example was able to be achieved by, first of all, establishment of a favorable relationship between the graphene 1 and the iron oxide 2 containing $Fe_3O_4$.

Next, formation of a spin injection electrode was attempted using a magnesium oxide (MgO) film with a thickness of 5 nm, instead of the iron oxide 2. The deposition of MgO was performed with a pulsed laser deposition method, using a MgO sintered body of 20 mm diameter×2 mm thickness as a target, and using an excimer laser (KrF, a wavelength of 248 nm) as a laser. The deposition conditions were that the substrate temperature was a room temperature to 300° C. (typically a room temperature), the atmosphere was a vacuum atmosphere of $10^{-5}$ to $10^{-6}$ Pa accompanied with no oxygen gas flow, and the power density for irradiation of the target was 4 to 10 J/cm$^2$ (typically 6 J/cm$^2$). The thickness of the deposited MgO film was calculated from the film formation rate. For the purpose of improving electrical contact with the bias applying unit 3 and the signal detecting unit 5, $Fe_3O_4$ (with a thickness of 50 nm) was further deposited on MgO as in the case of deposition of the iron oxides 2. The conditions for the deposition of $Fe_3O_4$ were the same as the deposition conditions described above.

To the graphene 1 and MgO having been thus formed, a voltage pulse having a pulse width of 1 μs and providing a potential difference of 3.5 V between the graphene and MgO was applied (with the graphene being positive). However, in spite of repeated application of the voltage pulse, the change in the interfacial resistance value between the graphene and MgO did not occur, and a spin injection electrode was not formed. This result is inferred to be derived from the fact that oxidation of Mg is more stable than oxidation of carbon in terms of the Gibbs free energy associated with oxidation. Specifically, this result is thought to be due to the fact that oxygen required for oxidation of graphene cannot be obtained from MgO.

Figure 9:
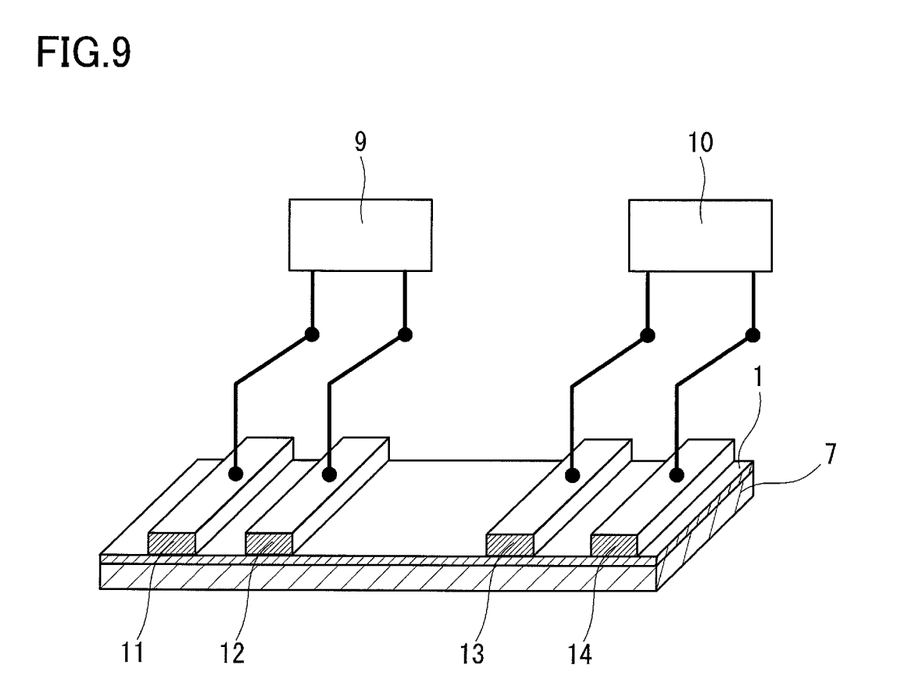
FIG. 9 is a schematic diagram illustrating a method employed in Examples for evaluation of the spin injection performance of a spin injection electrode.

Next, evaluation of the spin injection performance was carried out using the spin injection electrode fabricated as described above. The evaluation was conducted as follows. One iron oxide 2 and its adjacent iron oxide 2 were used as electrodes 11 and 12, respectively, and a current source 9 (current source 6221 manufactured by Keithley Instruments Inc.) was electrically connected to the electrodes 11 and 12. An iron oxide 2 other than the electrodes 11 and 12, and its adjacent iron oxide 2 were used as electrodes 13 and 14, respectively, and a voltmeter 10 (nanovoltmeter 2182A manufactured by Keithley Instruments Inc.) was electrically connected to the electrodes 13 and 14. Next, a current (several hundred μA to several mA) was applied to the electrode 12 from the electrode 11, and at this time, the change in voltage between the electrode 13 and the electrode 14 was measured to determine whether spins were injected into the graphene 1 from the iron oxides 2. This voltage measurement is substantially identical to the non-local resistance measurement that is described in Advanced Functional Materials, vol. 19, pp. 3711-3716 (2009), Journal of the Surface Science Society of Japan, vol. 31, pp. 162-168 (2010), Nature, vol. 448, pp. 571-575 (2007), and Physical Review B, vol. 77, 020402(R) (2008). When the voltage between the electrodes 13 and 14 was measured, a magnetic field was swept in the plane of the graphene 1 in parallel to the plane, and as a result, a magnetoresistance effect accompanied by hysteresis due to spin injection was confirmed at a room temperature. On the other hand, when the same evaluation was conducted for a sample to which an electric bias had not been applied yet and in which a barrier layer had not been formed yet, a magnetoresistance effect accompanied by hysteresis could not be confirmed. That is, it was confirmed that forming the barrier layer 4 by application of an electric bias between the graphene 1 and the iron oxide 2 is effective for producing a high-efficiency spin injection electrode.

Example 2

In Example 2, the change in the interfacial resistance value (resistance change ratio $R/R_0$) with respect to the change in the electric bias to be applied was evaluated. A stack of the sapphire substrate 7, the graphene 1, and the iron oxide 2, targeted for electric bias application, was fabricated similar to Example 1.

As the magnitude of the pulse voltage to be applied was increased from 3.5 V, the number of times Np of pulse application, at which the resistance change ratio $R/R_0$ sharply changes as shown in FIG. 8, was decreased. On the other hand, as the magnitude of the pulse voltage to be applied was decreased from 3.5 V the Np was increased.

In the case where the magnitude of the pulse voltage to be applied was fixed to 3.5 V, the Np was increased when the pulse width was reduced from 1 μs, whereas the Np was decreased when the pulse width was increased from 1 μs. In this manner, it was confirmed that the interfacial resistance value between the graphene 1 and the iron oxide 2 can be controlled and set by control of the conditions for electric bias application. Furthermore, these results indicate that the electric power for feed of an electric bias to be applied, and the Joule heat generated by application of the electric bias are involved with the control of the interfacial resistance value between the graphene 1 and the iron oxide 2 in the production method of the present disclosure.

The present invention may be embodied in other forms without departing from the spirit or essential characteristics thereof. The embodiments disclosed in this specification are to be considered in all respects as illustrative and not limiting. The scope of the present invention is indicated by the appended claims rather than by the foregoing description, and all changes which come within the meaning and range of equivalency of the claims are intended to be embraced therein.

INDUSTRIAL APPLICABILITY

The method for producing a spin injection electrode of the present disclosure can be realized by application of an electric bias to graphene and $Fe_3O_4$ that is in contact with the graphene. Therefore, carrying out the production method of the present disclosure does not necessarily require a special process, and thus the production method of the present disclosure has a high affinity with generally-used processes. In addition, the production method of the present disclosure is so simple that the process cost required for production of a spin injection electrode can be reduced. Accordingly, the production method can be easily employed in a process for realizing a spin device that uses graphene, and can also be applied as a basic process for producing various electronic devices.

What is claimed is:

1. A method for producing a spin injection electrode, comprising:
   a first step of preparing a multi-layer graphene, and an iron oxide that contains $Fe_3O_4$ and that is a ferromagnetic material contacting the graphene; and
   a second step of applying a voltage or a current between the graphene and the iron oxide, with an electric potential of the graphene being positive relative to that of the iron oxide, so as to:
   (a) convert a contact area of the graphene with the iron oxide into oxidized graphene by oxidation, and thus to form a barrier layer composed of the oxidized graphene between the graphene and the iron oxide; or
   (b) convert a contact area of the graphene with the iron oxide, and $Fe_3O_4$ contained in a contact area of the iron oxide with the graphene, into oxidized graphene and $Fe_2O_3$ respectively by oxidation, and thus to form a barrier layer composed of the oxidized graphene and $Fe_2O_3$ between the graphene and the iron oxide, and
   thereby forming a spin injection electrode that comprises the graphene, the iron oxide, and the barrier layer located at an interface between the graphene and the iron oxide, and that allows spins to be injected into the graphene from the iron oxide via the barrier layer.

2. The method for producing a spin injection electrode according to claim 1, wherein, in the second step, a pulse voltage or a pulse current is applied between the graphene and the iron oxide.

3. The method for producing a spin injection electrode according to claim 1, wherein
   the second step comprises: a first sub-step of applying the voltage or the current between the graphene and the iron oxide; a second sub-step of detecting an electric signal containing information on an electric resistance value between the graphene and the iron oxide; and a third sub-step of verifying whether the detected electric signal is an electric signal that is to be obtained when the electric resistance value has reached a predetermined value, and
   the first sub-step, the second sub-step, and the third sub-step are repeated in this order in the second step until the detected electric signal is determined as the electric signal that is to be obtained when the electric resistance value has reached the predetermined value.

4. The method for producing a spin injection electrode according to claim 1, wherein the iron oxide further containing $Fe_2O_3$ is prepared in the first step.

5. The method for producing a spin injection electrode according to claim 1, wherein, in the first step, the graphene and the iron oxide that is a ferromagnetic material contacting the graphene are prepared by depositing the iron oxide on a surface of the graphene with a pulsed laser deposition method.

* * * * *